(12) United States Patent
Tsubata

(10) Patent No.: US 9,494,622 B2
(45) Date of Patent: Nov. 15, 2016

(54) CURRENT MEASUREMENT DEVICE AND CURRENT MEASUREMENT METHOD

(71) Applicant: Fuji Jukogyo Kabushiki Kaisha, Tokyo (JP)

(72) Inventor: Hiroyuki Tsubata, Tokyo (JP)

(73) Assignee: FUJI JUKOGYO KABUSHIKI KAISHA, Tokyo (JP)

( * ) Notice: Subject to any disclaimer, the term of this patent is extended or adjusted under 35 U.S.C. 154(b) by 146 days.

(21) Appl. No.: 14/472,032

(22) Filed: Aug. 28, 2014

(65) Prior Publication Data

US 2015/0061642 A1    Mar. 5, 2015

(30) Foreign Application Priority Data

Aug. 29, 2013  (JP) ................ 2013-177872

(51) Int. Cl.
  *G01R 19/00*   (2006.01)
  *G01J 5/00*    (2006.01)

(52) U.S. Cl.
  CPC ......... *G01R 19/0092* (2013.01); *G01J 5/0096* (2013.01)

(58) Field of Classification Search
  USPC ...... 324/105, 240, 426, 427, 537; 374/5, 45, 374/57, 121, 137, 142; 73/774, 114.34, 73/204.18, 708; 702/64, 85, 99; 361/218, 361/87; 340/664; 430/348
  See application file for complete search history.

(56) References Cited

U.S. PATENT DOCUMENTS 7,520,666 B2 *   4/2009   Pevzner ................ G01N 25/72
                                              374/121

2003/0219059 A1 *  11/2003  Scott .................... G01N 25/72
                                              374/5
2008/0036448 A1     2/2008  Kovach et al.
(Continued)

FOREIGN PATENT DOCUMENTS

JP   2000-241463 A   9/2000
JP   2008-039775 A   2/2008
(Continued)

OTHER PUBLICATIONS

Yoichiro Tsumura, Tatsufumi Aoi, Hideo Yamakoshi, Koji Satake, Kazuo Yamamoto, "Surface magnetic field measurements using ferrite-core sensors", ICOLSE2009, Sep. 15, 2009.
(Continued)

*Primary Examiner* — Patrick Assouad
*Assistant Examiner* — Nasima Monsur
(74) *Attorney, Agent, or Firm* — McGinn IP Law Group, PLLC

(57) ABSTRACT

A current measurement device measures current flowing in a composite material M containing conductive fibers. The current measurement device includes a temperature measuring unit that measures the temperature of a surface of the composite material, upon flow of current in the composite material; a storage unit that stores conversion data that is acquired as a result of a conversion data acquisition test performed beforehand and that results from converting the temperature of the surface of the composite material to the value of the current flowing in the composite material; and a current calculator that, on the basis of the conversion data stored in the storage unit, converts the temperature of the surface of the composite material M as measured by the temperature measuring unit to a value of the current flowing in the composite material.

12 Claims, 9 Drawing Sheets

(56) References Cited

U.S. PATENT DOCUMENTS

| | | | |
|---|---|---|---|
| 2010/0033565 A1* | 2/2010 | Benzerrouk | G06T 7/0004 |
| | | | 348/125 |
| 2012/0119761 A1 | 5/2012 | Pons et al. | |
| 2012/0197558 A1* | 8/2012 | Henig | G01K 11/265 |
| | | | 702/58 |

FOREIGN PATENT DOCUMENTS

| | | |
|---|---|---|
| JP | 2008-536108 A | 9/2008 |
| JP | 2013-501216 A | 1/2013 |
| WO | WO 2007/022087 A2 | 2/2007 |

OTHER PUBLICATIONS

JPO Decision of Grant dated Nov. 17, 2015.

JPO Notification of Reasons for Refusal dated Apr. 7, 2015.

\* cited by examiner

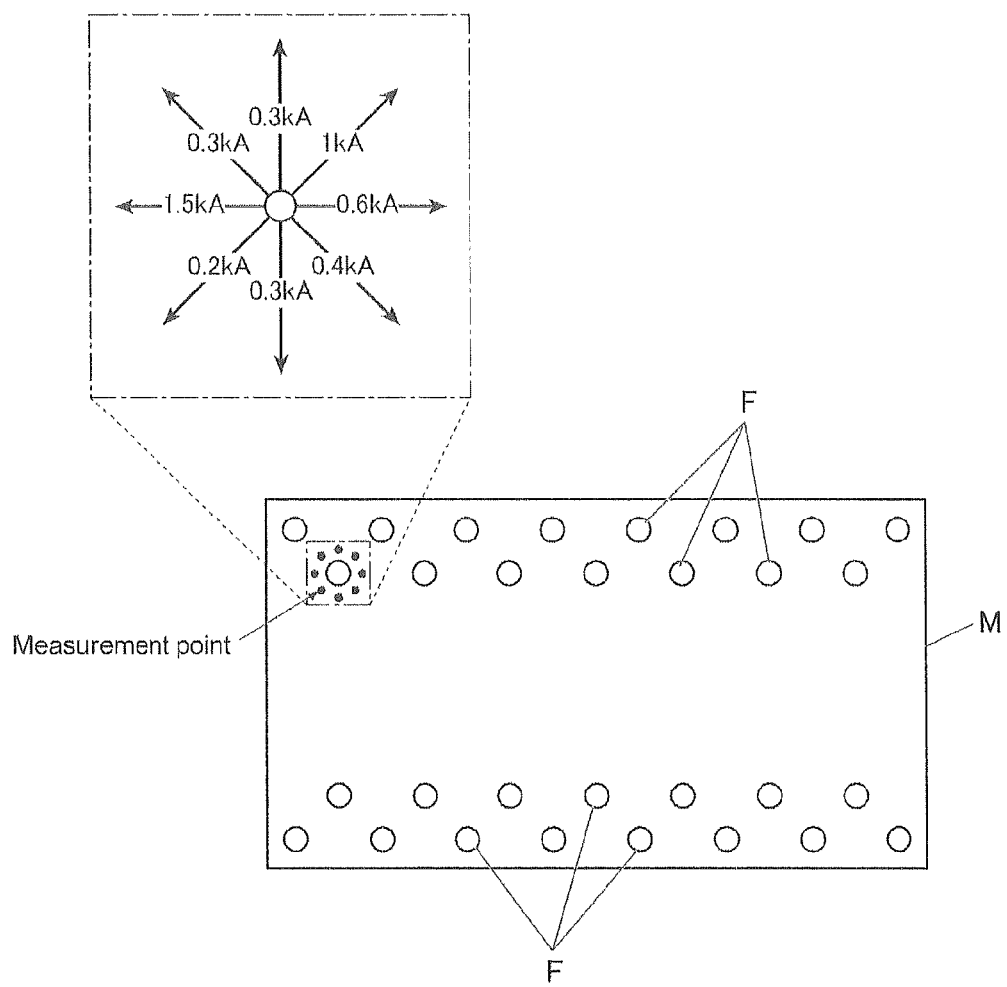

CURRENT MEASUREMENT DEVICE AND CURRENT MEASUREMENT METHOD

CROSS-REFERENCE TO RELATED APPLICATIONS

The present application claims priority from Japanese Patent Application No. 2013-177872 filed on Aug. 29, 2013, the entire contents of which are hereby incorporated by reference.

BACKGROUND

1. Technical Field

The present invention relates to a current measurement device and a current measurement method for measuring current that flows in a composite material containing conductive fibers.

2. Related Art

Lightning strike countermeasures for preventing the occurrence of, for instance ignition of fuel caused by sparks derived from a lightning strike, are a necessary feature in the design of aircraft airframes. Elucidation of the distribution of current in the airframe during a lightning strike is an important issue to be addressed when devising such lightning strike countermeasures. In particular, there is a demand for detailed elucidation of current distributions in composite materials such as carbon-fiber reinforced plastic (CFRP), the usage whereof in airframes has been growing in recent years.

However, currents flowing in composite materials differ from currents that flow in a metallic material. In the former case, currents are distributed in a complex manner due to, for instance, the influence of the plurality of fiber directions. Accordingly, techniques are required that allow measuring, more accurately, the currents that flow in the fibers of a composite material, in order to elucidate the current distributions in the material.

Rogowski coils or magnetic sensors are ordinarily used for current measurement. A Rogowski coil is a ring-like coil that is capable of measuring large currents. Current can be measured herein on the basis of voltage induced between both ends of the coil, by arranging the latter so as to surround a measurement site. A magnetic sensor detects magnetic fields at the measurement-site surface, such that currents can be measured on the basis of these magnetic fields (refer to, for instance, Yoichiro Tsumura, Tatsufumi Aoi, Hideo Yamakoshi, Koji Satake, Kazuo Yamamoto, "Surface magnetic field measurements using ferrite-core sensors", ICOLSE 2009, Sep. 15, 2009)

However, current measurement relying on Rogowski coils and magnetic sensors is not suited, in view of the points below, for the measurement of currents that flow in fibers of a composite material. Measurements using Rogowski coils require the coils to be disposed surrounding fibers in a composite material, and, accordingly, holes must be opened in the composite material itself. A concern arises thereupon in that the holes may exert an influence on the current distribution. Measurements relying on magnetic sensors do not require opening of holes in the composite material; however, accurate current distributions cannot be grasped unless extremely small magnetic sensors are used, since the flow of current around fibers changes within distances in the order of several mm. Such small magnetic sensors are readily susceptible to noise, and are difficult to produce in the first place.

SUMMARY OF THE INVENTION

In the light of the above, it is an object of the present invention to provide a current measurement device and a current measurement method that enable suitable measurement of current that flows in a composite material.

In order to attain the above goal, the invention according to a first aspect provides a current measurement device for measuring current flowing in a composite material containing conductive fibers, the current measurement device including: a temperature measuring unit for measuring the temperature of a surface of the composite material, upon flow of current in the composite material; a storage unit for storing conversion data that is acquired through a preliminary test carried out beforehand, and that results from converting the temperature of the composite material surface to a value of current flowing in the composite material; and a current calculator for, on the basis of the conversion data stored in the storage unit, converting the temperature of the composite material surface, as measured by the temperature measuring unit, to a value of current flowing in the composite material.

A second aspect of the present invention provides the current measurement device according to the first aspect, in which, preferably, the composite material may be a laminate resulting from layering a plurality of fiber layers including fiber layers having mutually dissimilar fiber directions, with the laminate being penetrated by fasteners of fastening pieces; and the temperature measuring unit may measure the temperature of the composite material surface in each fiber direction centered on the fastener.

A third aspect of the present invention provides the current measurement device according to the second aspect, in which, preferably, the conversion data may be acquired in each fiber direction, in the preliminary test, through measurement of temperature and current values in respective fiber directions centered on a current-applying electrode at the time of application of current to a specimen of a material identical to the composite material; and the current calculator may convert the temperature of the composite material surface in each fiber direction, as measured by the temperature measuring unit, to a current value by using the conversion data in the corresponding fiber direction.

A fourth aspect of the present invention provides the current measurement device according to any one of the first through third aspects, in which, preferably, the temperature measuring unit may be a thermographic camera.

A fifth aspect of the present invention provides a current measurement method of measuring current that flows in a composite material containing conductive fibers, the method including: a temperature measurement step of measuring the temperature of a surface of the composite material, upon flow of current in the composite material by using a storage unit for storing conversion data that is acquired through a preliminary test carried out beforehand and that results from converting the temperature of the composite material surface to a value of current flowing in the composite material; and a current calculation step of, on the basis of the conversion data stored in the storage unit, converting the temperature of the composite material surface, as measured in the temperature measurement step, to the value of current flowing in the composite material.

A sixth aspect of the present invention provides the current measurement method according to the fifth aspect, in which, preferably, as the composite material a laminate resulting from layering a plurality of fiber layers including fiber layers having mutually dissimilar fiber directions may be used, with the laminate being penetrated by fasteners of fastening pieces; and in the temperature measuring step the temperature of the composite material surface in respective fiber directions centered on the fasteners may be measured.

A seventh aspect of the present invention provides the current measurement method according to the sixth aspect, in which, preferably, the conversion data in each fiber direction may be acquired, in the preliminary test, through measurement of temperature and current values in respective fiber directions centered on a current-applying electrode, upon application of current to a specimen of a material identical to the composite material; and in the current calculation step, the temperature of the composite material surface in each fiber direction, as measured in the temperature measurement step, may be converted to a current value by using the conversion data in the corresponding fiber direction.

An eighth aspect of the present invention provides the current measurement method according any one of the fifth to seventh aspects, in which, preferably, the temperature of the composite material surface may be measured, in the temperature measurement step, using a thermographic camera.

In the present invention, the temperature of the surface of a composite material upon flow of current in the latter is measured, and the current flowing in the composite material is measured by converting the temperature of the composite material surface to a current value, on the basis of conversion data acquired through a preliminary test performed beforehand. Unlike in conventional instances, therefore, the current flowing in the composite material can be suitably measured without the need for hole drilling in a composite material, or the need for using sensors that are difficult to operate.

BRIEF DESCRIPTION OF THE DRAWINGS

FIG. 9 is a diagram illustrating an image display example of measurement results in a current measurement method.

DETAILED DESCRIPTION

Examples of the present invention will be explained next with reference to accompanying drawings.

Figure 1:
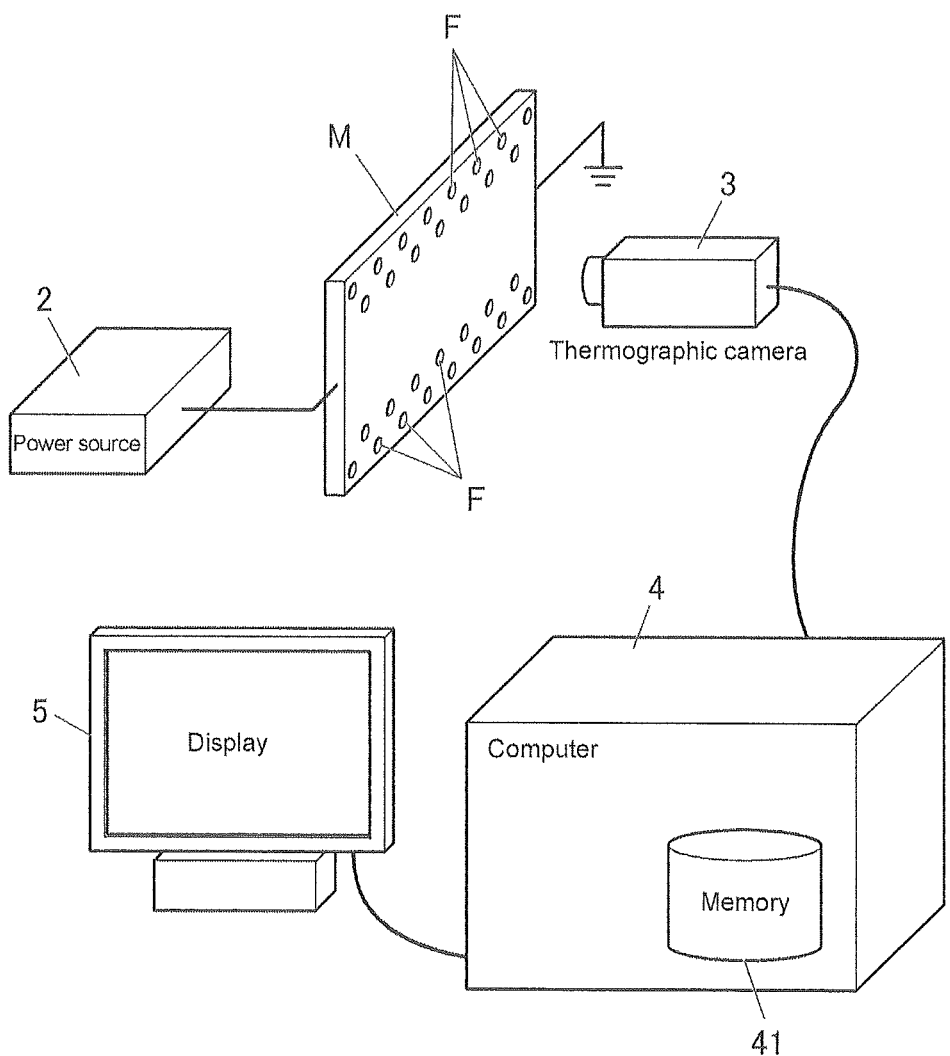
FIG. 1 is a diagram illustrating conceptually the configuration of a current measurement device.

FIG. 1 is a diagram illustrating conceptually the configuration of a current measurement device 1 according to the present example. As illustrated in the figure, the current measurement device 1 is a device that measures current flowing in a composite material M. In particular, the current measurement device 1 is a device for elucidating the current distribution in the composite material M, as a composite material for airframe structural materials of aircraft, at the time of a lightning strike.

The composite material M to be measured is a fiber-reinforced plastic in which a resin is reinforced with conductive fibers. In the present example, the composite material M is carbon-fiber reinforced plastic (CFRP) comprising carbon fibers. The composite material M is a quasi-isotropic laminate (see FIG. 5), shaped substantially as a flat plate, and that results from stacking two sets of four fiber layers (i.e. total of eight layers) the fiber directions whereof are offset by 45° with respect to each other, in each set. A plurality of metallic fasteners F . . . , as fastening pieces, penetrate the composite material M, in accordance with a predetermined array that imitates the layout in actual aircraft. Arc discharge occurs around the fasteners F if current concentrates excessively in some of the fasteners F upon a lightning strike in actual aircraft. Such discharge may give rise to problems of, for instance, fuel ignition. Accordingly, emphasis will be laid, in the explanation below, on grasping in particular the current distribution around the fasteners F.

Specifically, the current measurement device 1 comprises a power source 2, a thermographic camera 3 and a computer 4. The power source 2 is an impulse generator capable of applying current that is modeled after a lightning current waveform, and is electrically connected to one end of the composite material M. The housing of the power source 2 is connected to ground, and the other end of the composite material M is electrically connected to the housing.

The thermographic camera 3, which is a camera that can measure the temperature of an object by capturing infrared rays emitted by the object, is disposed in such a way so as to measure the temperature (temperature distribution) of the surface of the composite material M.

Figure 2:
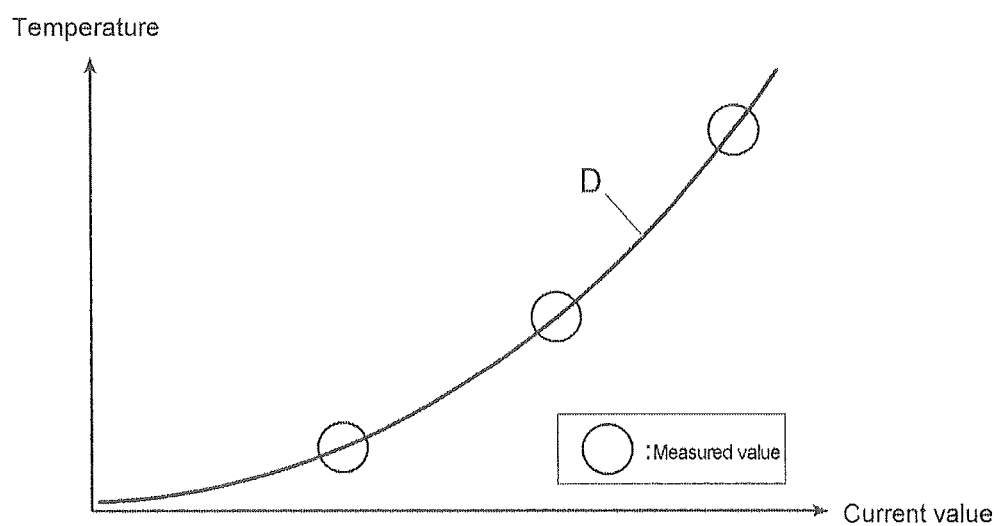
FIG. 2 is a diagram illustrating conversion data resulting from converting the temperature of the surface of a composite material to a current value in the composite material.

The computer 4 is connected to the thermographic camera 3, and calculates the current flowing in the composite material M on the basis of the temperature of the surface of the composite material M as measured by the thermographic camera 3, as described below. Specifically, the computer 4 stores, in a memory 41, conversion data D resulting from converting the temperature of the surface of the composite material M to a current value. The current flowing in the composite material M is calculated, on the basis of the temperature of the surface of the composite material M, using this conversion data D. As illustrated in FIG. 2, the conversion data D is a curve that denotes the relationship between the temperature of the surface of the composite material M and the current flowing in the composite material M. There exist respective curves for the eight fiber directions described below. The conversion data D is acquired beforehand as a result of a below-described conversion data acquisition test, and is stored in the memory 41. The computer 4 is connected to a display 5. The temperature of the surface of the composite material M (temperature distribution), current (current distribution) and so forth can be displayed thus on the display 5.

Figure 3:
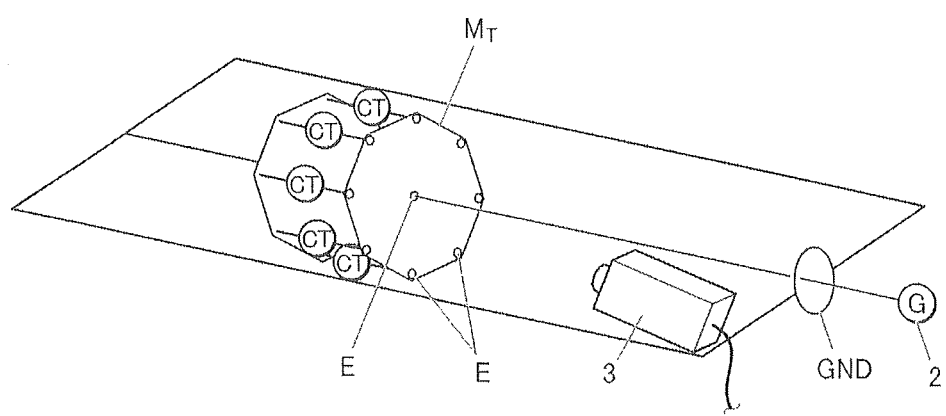
FIG. 3 is a schematic diagram illustrating the layout of the devices in a conversion data acquisition test.

The conversion data acquisition test in which the conversion data D is acquired will be explained next. FIG. 3 is a schematic diagram illustrating the layout of the devices in the conversion data acquisition test, FIG. 4 is a wiring diagram of the conversion data acquisition test, and FIG. 5 is a cross-sectional diagram of a composite material $M_T$ being a specimen for the conversion data acquisition test.

Figure 4:
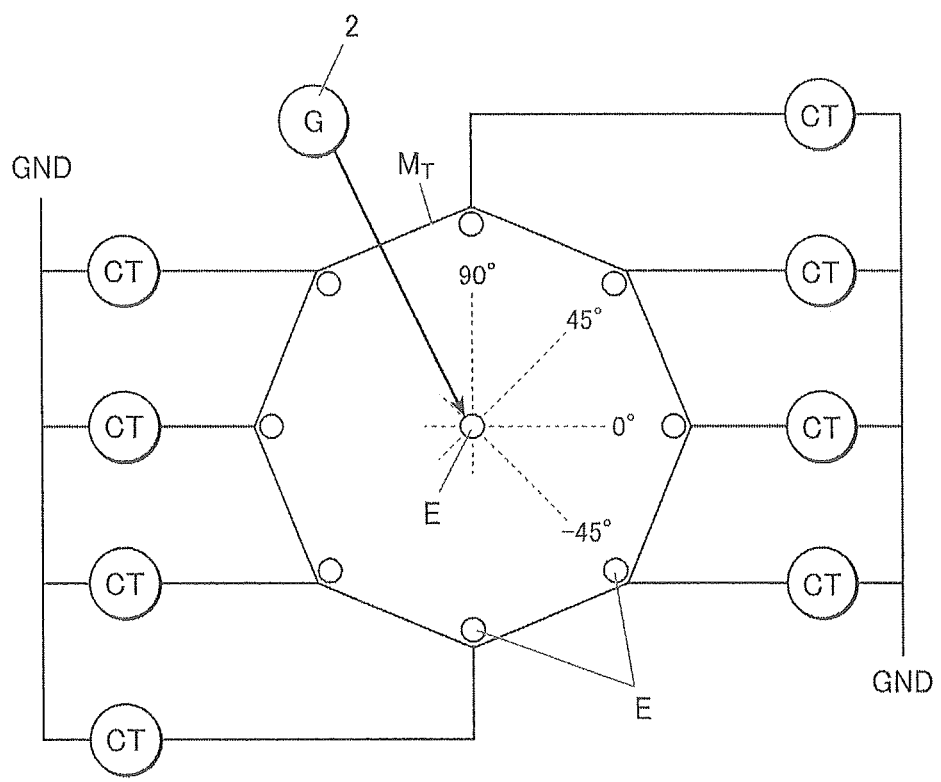
FIG. 4 is a wiring diagram in a conversion data acquisition test.
Figure 5:
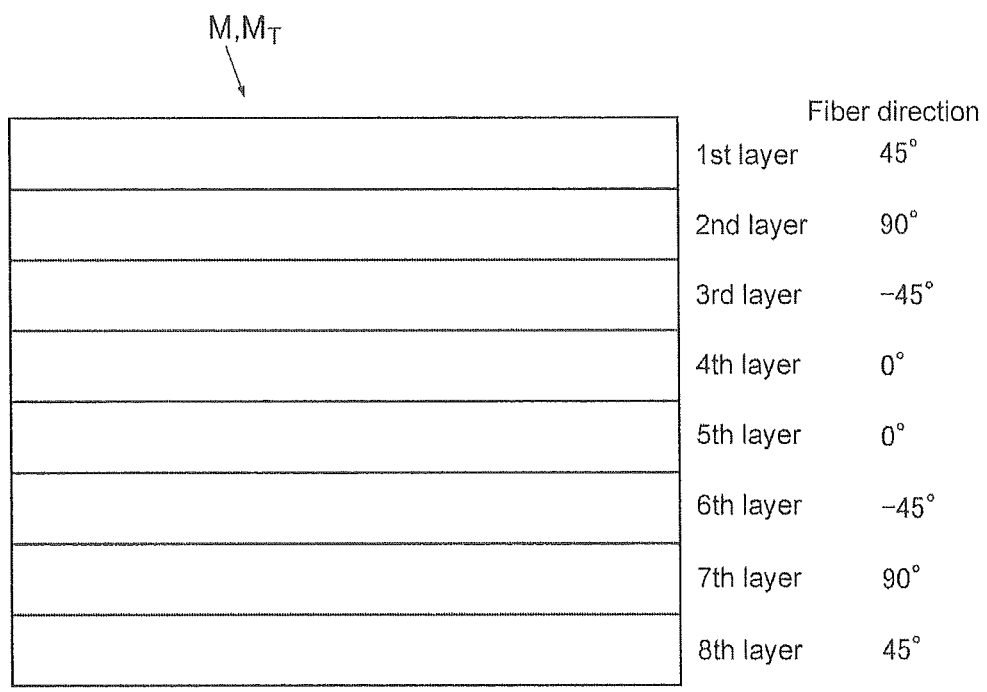
FIG. 5 is a cross-sectional diagram of a composite material.

In the conversion data acquisition test, a pseudo-lightning current is caused to pass through a composite material $M_T$, as a specimen, and the temperature of the surface of the composite material $M_T$ and current values along respective fiber directions of the composite material $M_T$ are measured, as illustrated in FIG. 3 and FIG. 4.

The material of the composite material $M_T$, as the specimen, is obviously the same as that of the composite material M for the main test described above. Herein, the composite material $M_T$ is provided in such a manner that current flows uniformly in a plurality of fiber directions centered around current-applying electrodes E. That is because that the flow of current along the fiber directions is noticeable only around the electrodes E, and also because the measured values of temperature are influenced, in a complex manner, by the current values and by the distance from the fiber layers to the temperature measurement surface (i.e. by time lags in heat propagation), when current flows non-uniformly in a plurality of fiber directions.

Specifically, the composite material $M_T$ is formed to an octagonal shape the corners whereof correspond to respective fiber directions. The composite material $M_T$ is penetrated by electrodes E at eight respective corners, and at the center, as illustrated in FIG. 4 and FIG. 5. The power source 2 is connected to the central electrode E, and the eight peripheral electrodes E are connected to a GND line, so as to cause current to flow from the center to the eight peripheral locations. In the present example, the eight peripheral electrodes E are connected to a grounded shield plate that surrounds the perimeter of the composite material $M_T$. The eight peripheral electrodes E are attached to respective current transformers (CTs) for measuring respective current values. Members that afford homogeneous electric contact properties with the composite material $M_T$, for instance conductive sleeved fasteners or the like, are preferably used herein as the electrodes E. Preferably, wiring is routed from the power source 2 in accordance with the target layout, in such a manner that currents flow homogeneously in the composite material $M_T$.

Figure 6:
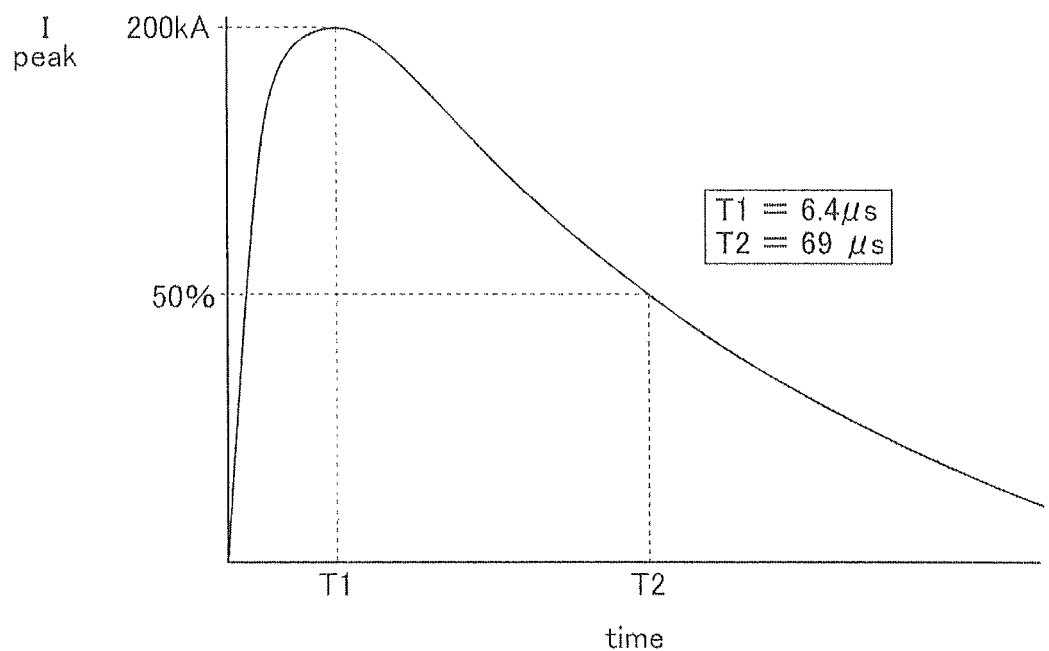
FIG. 6 is a diagram illustrating a typical lightning current waveform (SAE ARP 5412 Component A waveform)

After setting of the test apparatus, pseudo-lightning current is applied, from the power source 2, to the composite material $M_T$, and the surface of the composite material $M_T$ at that time is captured by the thermographic camera 3, while the currents flowing along the fiber directions are measured by the CTs. The pseudo-lightning current applied from the power source 2 simulates in this case a typical lightning current waveform. As illustrated in FIG. 6, a SAE ARP 5412 Component A waveform was set in the present example. As the figure shows, the lightning current is instantaneous, as compared with the propagation speed of heat, in that the lightning current rises in several μsec and decays thereafter in several tens of μsec. Accordingly, the images captured by the thermographic camera 3 can be regarded as the total heat imparted to the composite material $M_T$ by the current.

Figure 7:
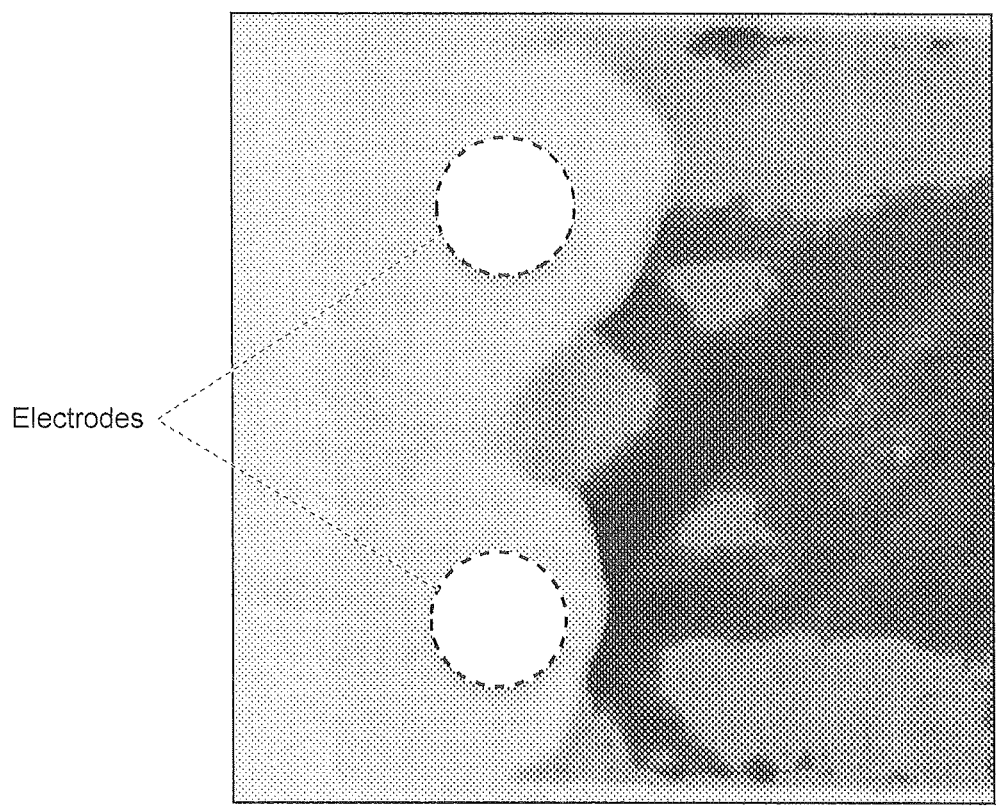
FIG. 7 is an example of a captured thermographic image of the surface of a composite material.

FIG. 7 is an example of a captured thermographic image of the surface of the composite material $M_T$. As illustrated in the figure the temperature of the surface of the composite material $M_T$ rises from the electrodes E, along the fiber directions 0°, (rightward in FIG. 7), 45° (upward and rightward) and −45° (downward and rightward). This indicates that the main flow of current in the fibers takes place around the electrodes E.

The measurement for obtaining the conversion data D involves acquiring a plurality of current values (peak values), by way of the CTs, with sweeping of applied current values, and measuring thereupon the respective temperatures at positions spaced apart from the electrodes E by a predetermined distance. The conversion data D is worked out in the form of an interpolation curve of a plurality of measured temperatures and current values, as illustrated in FIG. 2. Eight sets of conversion data D are acquired, for the eight fiber directions, by performing this operation in the fiber eight fiber directions. During the measurements, it is checked that the current values at the eight CTs are substantially identical, each time that current is applied. Action integral values may be used, instead of peak values, as the current values, to work out the conversion data D.

Figure 8:
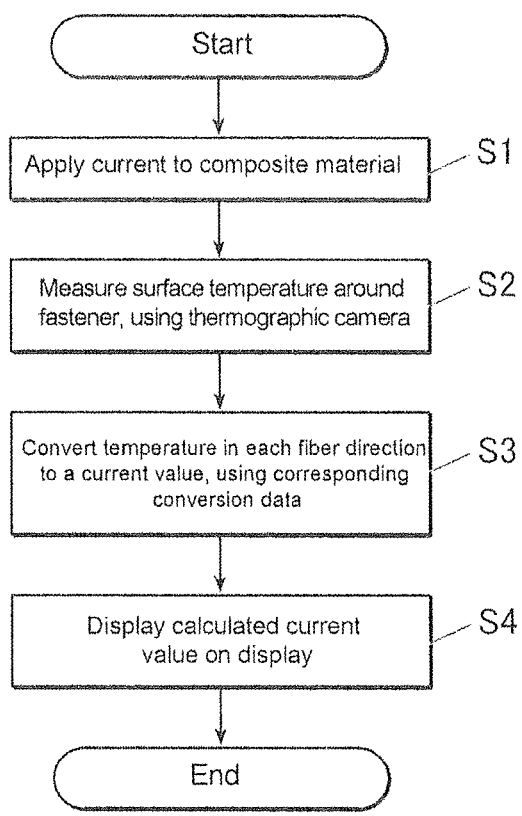
FIG. 8 is a flowchart illustrating the process flow in a current measurement method.

The method for measuring the current in the composite material M, using the current measurement device 1, is explained next. FIG. 8 is a flowchart illustrating the flow of the current measurement method. FIG. 9 is a diagram illustrating an image display example of measurement results in the current measurement method.

Firstly, in the device setting state illustrated in FIG. 1, pseudo-lightning current is applied from the power source 2 towards the composite material M, as illustrated in FIG. 8; thereby, current is caused to flow from one end of the composite material M to the other end (step S1). The pseudo-lightning current that is applied from the power source 2 is set to a current waveform identical to that at the time of the above-described conversion data acquisition test.

The temperature of the surface of the composite material M is measured through imaging, by the thermographic camera 3, of the surface of the composite material M when energized (step S2). The temperature around a predetermined fastener F is measured. The measured temperature data (thermographic image) is outputted to the computer 4 and is stored in the memory 41.

Next, the temperature of the surface of the composite material M as measured by the thermographic camera 3 is converted to a value of current flowing in the composite material M, on the basis of the conversion data D (step S3). Herein, the computer 4 extracts, from the temperature data of the surface of the composite material M, the temperatures at positions spaced apart, by a predetermined distance, from the fasteners F, in a predetermined fiber direction, and converts the temperatures to current values, using the conversion data D in the corresponding fiber directions. The computer 4 performs this temperature-current conversion for the eight fiber directions, and calculates the values of current flowing in the eight fiber directions.

The values of current flowing in the respective eight fiber directions, centered on the fasteners F, are thus calculated, and the calculated current values are displayed on the display 5, for instance in the form of an image such as the one depicted in FIG. 9 (step S4).

In the present example, thus, the temperature of the surface of the composite material M at a time where current flows in the composite material M is measured, and the current flowing in the composite material M is measured by converting the temperature of the surface of the composite material M to a current value on the basis of conversion data D acquired as a result of a conversion data acquisition test performed beforehand. Unlike conventional instances, therefore, the current flowing in the composite material M can be suitably measured without the need for hole drilling in a composite material, or the need for using sensors that are difficult to operate.

In the conversion data acquisition test, conversion data D in respective fiber directions, centered on a current-applying electrode, is acquired beforehand; thereupon, the temperature of the surface of the composite material M in each fiber direction centered on the fasteners F is measured, and the temperature of the surface of the composite material M in each fiber direction is converted to a current value using the conversion data D in the corresponding fiber direction.

Therefore, it becomes possible to grasp the current distribution in the plurality of fiber directions around the fasteners F.

The temperature of the surface of the composite material M upon flow of current in the composite material M is measured by the thermographic camera 3. Therefore, it becomes possible to visualize, in the form of a thermographic image, the way in which current flows in the fibers of the composite material M.

Examples in which the present invention can be utilized are not limited to the examples described above, and may include various suitable modifications without departing from the scope of the present invention.

For instance, the composite material M ($M_T$) used in the examples is a quasi-isotropic laminate resulting from stacking two sets of four fiber layers (i.e. total of eight layers) the fiber directions whereof are offset by 45° with respect to each other, in each set. However, the composite material M ($M_T$) is not limited to such a quasi-isotropic laminate.

Further, the current measurement device 1 may be configured in such a manner that the operation of the power source 2 and the thermographic camera 3 is centrally controlled by the computer 4, so that current is automatically measured just through input of predetermined information (for instance, position information of the fasteners F to be measured).

The invention claimed is:

1. A current measurement device for measuring current flowing in a composite material containing conductive fibers, the current measurement device comprising:
    a temperature measuring unit that measures a temperature of a surface of the composite material, upon a flow of current in the composite material;
    a storage unit that stores conversion data that is acquired through a preliminary test carried out beforehand and that results from converting the temperature of the composite material surface to a value of current flowing in the fibers in the composite material; and
    a current calculator that, on a basis of the conversion data stored in the storage unit, converts the temperature of the composite material surface, as measured by the temperature measuring unit, to a value of current flowing in the fibers in the composite material,
    wherein the composite material comprises a laminate resulting from layering a plurality of fiber layers including fiber layers having mutually dissimilar fiber directions, the laminate being penetrated by fasteners of fastening pieces,
    wherein the conversion data is acquired in each fiber direction, in the preliminary test, through a measurement of temperature and current values in respective fiber directions centered on a current-applying electrode at a time of application of current to a specimen of a material identical to the composite material,
    wherein the temperature measuring unit measures the temperature of the composite material surface in respective fiber directions centered on the fasteners, and
    wherein the current calculator converts the temperature of the composite material surface in each fiber direction, as measured by the temperature measuring unit, to a current value by using the conversion data in the corresponding fiber direction.

2. The current measurement device according to claim 1, wherein the temperature measuring unit comprises a thermographic camera.

3. A current measurement method of measuring current that flows in a composite material containing conductive fibers, the method comprising:
    measuring a temperature of a surface of the composite material, upon a flow of current in the composite material by using a storage unit for storing conversion data that is acquired through a preliminary test carried out beforehand and that results from converting the temperature of the composite material surface to a value of current flowing in the fibers in the composite material; and
    on a basis of the conversion data stored in the storage unit, converting the temperature of the composite material surface, as measured in the measuring of the temperature, to the value of current flowing in the fibers in the composite material,
    wherein, as the composite material, a laminate resulting from layering a plurality of fiber layers including fiber layers having mutually dissimilar fiber directions is used, the laminate being penetrated by fasteners of fastening pieces,
    wherein, in the preliminary test, the conversion data in each fiber direction is acquired through a measurement of temperature and current values in respective fiber directions centered on a current-applying electrode, upon application of current to a specimen of a material identical to the composite material,
    wherein, in the measuring of the temperature, the temperature of the composite material surface in respective fiber directions centered on the fasteners is measured, and
    wherein, in the converting of the temperature, the temperature of the composite material surface in each fiber direction, as measured in the measuring of the temperature, is converted to a current value by using the conversion data in the corresponding fiber direction.

4. The current measurement method according to claim 3, wherein in the measuring of the temperature, the temperature of the composite material surface is measured using a thermographic camera.

5. The current measurement device according to claim 1, wherein the composite material comprises a fiber-reinforced plastic in which a resin is reinforced with the conductive fibers.

6. The current measurement device according to claim 1, wherein the plurality of fiber layers comprises two sets of multiple fiber layers such that, in each set, the fiber directions are offset by 45° with respect to each other.

7. The current measurement device according to claim 1, wherein the temperature measuring unit measures the temperature of the surface of the composite material by capturing infrared rays emitted by the surface of the composite material.

8. The current measurement device according to claim 1, wherein the temperature measuring unit is configured to measure a temperature distribution on the surface of the composite material.

9. The current measurement method according to claim 3, wherein the composite material comprises a fiber-reinforced plastic in which a resin is reinforced with the conductive fibers.

10. The current measurement method according to claim 3, wherein the plurality of fiber layers comprises two sets of multiple fiber layers such that, in each set, the fiber directions are offset by 45° with respect to each other.

11. The current measurement method according to claim 3, wherein the measuring of the temperature comprises measuring the temperature of the surface of the composite material by capturing infrared rays emitted by the surface of the composite material.

12. The current measurement method according to claim 3, wherein the measuring of the temperature comprises measuring a temperature distribution on the surface of the composite material.

* * * * *